United States Patent [19]

Lien et al.

[11] Patent Number: 4,725,753

[45] Date of Patent: Feb. 16, 1988

[54] PIEZOELECTRIC TRANSDUCER

[75] Inventors: Neil C. Lien, Evansville; John D. Stolz, Milwaukee, both of Wis.

[73] Assignee: Baker Manufacturing Company, Evansville, Wis.

[21] Appl. No.: 915,384

[22] Filed: Oct. 6, 1986

[51] Int. Cl.$^4$ ............................................ H01L 41/08
[52] U.S. Cl. ...................... 310/328; 310/366
[58] Field of Search ............... 310/328, 366, 330–332, 310/346

[56] References Cited

U.S. PATENT DOCUMENTS

| | | | |
|---|---|---|---|
| 3,461,910 | 8/1969 | Selsam et al. | 310/328 X |
| 4,438,364 | 3/1984 | Morison | 310/328 |
| 4,460,842 | 7/1984 | Waanders et al. | 310/328 X |
| 4,488,080 | 12/1984 | Baumann | 310/346 X |
| 4,651,046 | 3/1987 | Ohya et al. | 310/328 |

OTHER PUBLICATIONS

UHV Piezoelectric Translator, by T. Oversluizen & G. Watson, paper submitted @ 1985, Synchrotron Radiation Instrumentation Conference, Stanford, CA., Jul. 29–Aug. 2, 1985, (10 pages).

Primary Examiner—Mark O. Budd
Attorney, Agent, or Firm—Isaksen, Lathrop, Esch, Hart & Clark

[57] ABSTRACT

A piezoelectric transducer for use in precision remote movement of an object in an ultra-high vacuum environment is disclosed which includes an elongated central shaft with proximal end and distal end, a distal stop fixed to the distal end of the shaft with connection means for connecting the distal stop to the object to be moved, a plurality of piezoelectric disks entrained on the shaft, a plurality of electrically conductive plates entrained on the shaft and arranged interspersed alternately with the piezoelectric disks, each plate including an annular portion entrained on the shaft and an arm extending radially outward from the annular portion. The plates are arranged into two groups with each alternate plate being in the alternate group, so that all of the plates of each group have their arms extending radially in parallel. The piezoelectric transducer also includes an electrically conductive stud with each of the groups of plates, each stud electrically and mechanically joining the arms of all of the plates in the group so that a potential applied across the two studs is imposed on the piezoelectric disks. Additionally, the piezoelectric transducer includes a pair of insulators which are entrained on the shaft adjacent to the electrically conductive plates which are outermost on the shaft.

17 Claims, 8 Drawing Figures

PIEZOELECTRIC TRANSDUCER

BACKGROUND OF THE INVENTION

1. Field of the Invention

The present invention relates to devices used to make precision remote movements of an object within an ultra-high vacuum. More specifically, the present invention relates to a piezoelectric transducer having an elongated central shaft, electrically conductive plates and piezoelectric disks interspersedly entrained on the shaft, a mounting block for mounting an end of the shaft, the mounting block including a biasing means for resiliently biasing the shaft to move in the direction of the mounted end, and a pair of keyed insulators which are entrained on the shaft and which fix two groups of electrically conductive plates in angular position relative to each other.

2. Description of the Related Art

It has been known that piezoelectric transducers may be used for remote fine manipulations or translations of machines. It has previously been proposed that such a transducer may provide some advantages useful in an ultra-high vacuum environment down to $1 \times 10^{-8}$ torr. Such a device includes an elongated central shaft with proximal end and a distal end, a plurality of piezoelectric disks entrained on the shaft, a plurality of electrically conductive plates entrained on the shaft and arranged interspersed alternately with the piezoelectric disks, the plates arranged into two groups with each alternate plate in the alternate group, an electrically conductive stud for each of the two groups of plates, each stud electrically connecting all the plates in the group so that a potential can be imposed on the piezoelectric disks by imposing a potential on the two studs, and a pair of insulators entrained on the shaft, so that the plates and piezoelectric disks are held in a stack between the insulators. When a potential is imposed on the piezoelectric disks, they expand, thereby causing the stack to expand. Arms on the two groups of plates have been held in a angular position relative to each other using epoxy glue. The epoxy glue will hold the two groups of electrically conductive plates so that the arms of the two groups are held in a chosen angular position relative to each other in ultra-high vacuums as low as $1 \times 10^{-8}$ torr, but not lower, due to the glue's high vapor pressure. There is a need, however, for piezoelectric transducers which will be able to function properly in ultra-high vacuums of $1 \times 10^{-10}$ torr or below.

SUMMARY OF THE INVENTION

The present invention is summarized in that a piezoelectric transducer for precision remote movement of an object in ultra-high vacuum environment includes an elongated central shaft having a proximal end and a distal end, a distal stop fixed to the distal end of the shaft, the distal stop including connection means for connecting to the object to be moved, a plurality of piezoelectric disks entrained on the shaft, and a plurality of electrically conductive plates entrained on the shaft and arranged interspersed alternatively with piezoelectric disks where the plates are arranged into two groups with each alternate plate in the alternate group. Each plate includes an annular portion entrained on the shaft and an arm extending radially outwardly from the annular portion so that all of the plates of each group have their arms extending radially in parallel. The piezoelectric transducer further includes an electrically conductive stud for each of the two groups of plates, each stud electrically connecting all of the plates in the group so that a potential can be imposed on the piezoelectric disks by imposing a potential on the two studs. Additionally the piezoelectric transducer includes a mounting block which has a fixed portion and a moveable portion joined by a flexural spring. The proximal end of the shaft is secured to the moveable portion of the mounting block and the piezoelectric disks and the plates are held pressed between the fixed portion of the mounting block and the distal stop so that expansion of the piezoelectric disks under an applied potential moves the distal stop and therefore also the object to be moved away from the fixed portion of the mounting block against the force of the flexural spring. A pair of insulators are also entrained on the shaft, one between the distal stop and its nearest plate and one between the mounting block and its nearest plate so that the insulators are also held in the stack between the distal stop and mounting block. The insulators have projections to engage the arms of at least the two plates which are adjacent to the insulators to fix the arms of the plates in angular position relative to each other and to thus fix all the plates in each of the two groups in fixed angular position to those in the other group.

A primary object of the present invention is to provide a piezoelectric transducer for the precision remote movement of an object in an ultra-high vacuum environment.

A second object of the present invention is to provide a piezoelectric transducer which can operate in an ultra-high vacuum environment of $1 \times 10^{-10}$ torr.

Another object of the invention is to provide a piezoelectric transducer mounted at its proximal end to a mounting block which includes a fixed portion and a moveable portion joined by an integral flexural spring which biases the shaft to move in the direction of its proximal end.

An additional object of the invention is to provide a piezoelectric transducer with two insulators entrained on the elongated central shaft, the insulators having projections which engage the arms of at least two of the plates adjacent to the insulator to fix the arms of the electrically conductive plates to each other to thus fix all of the plates to each of the two groups in fixed angular position relative to those arms in the other group.

Other objects, features, and advantages of the invention will be apparent from the following detailed description taken in conjunction with the accompanying drawings wherein a preferred embodiment of the invention has been selected for exemplification.

DESCRIPTION OF THE PREFERRED EMBODIMENT

Figure 1:
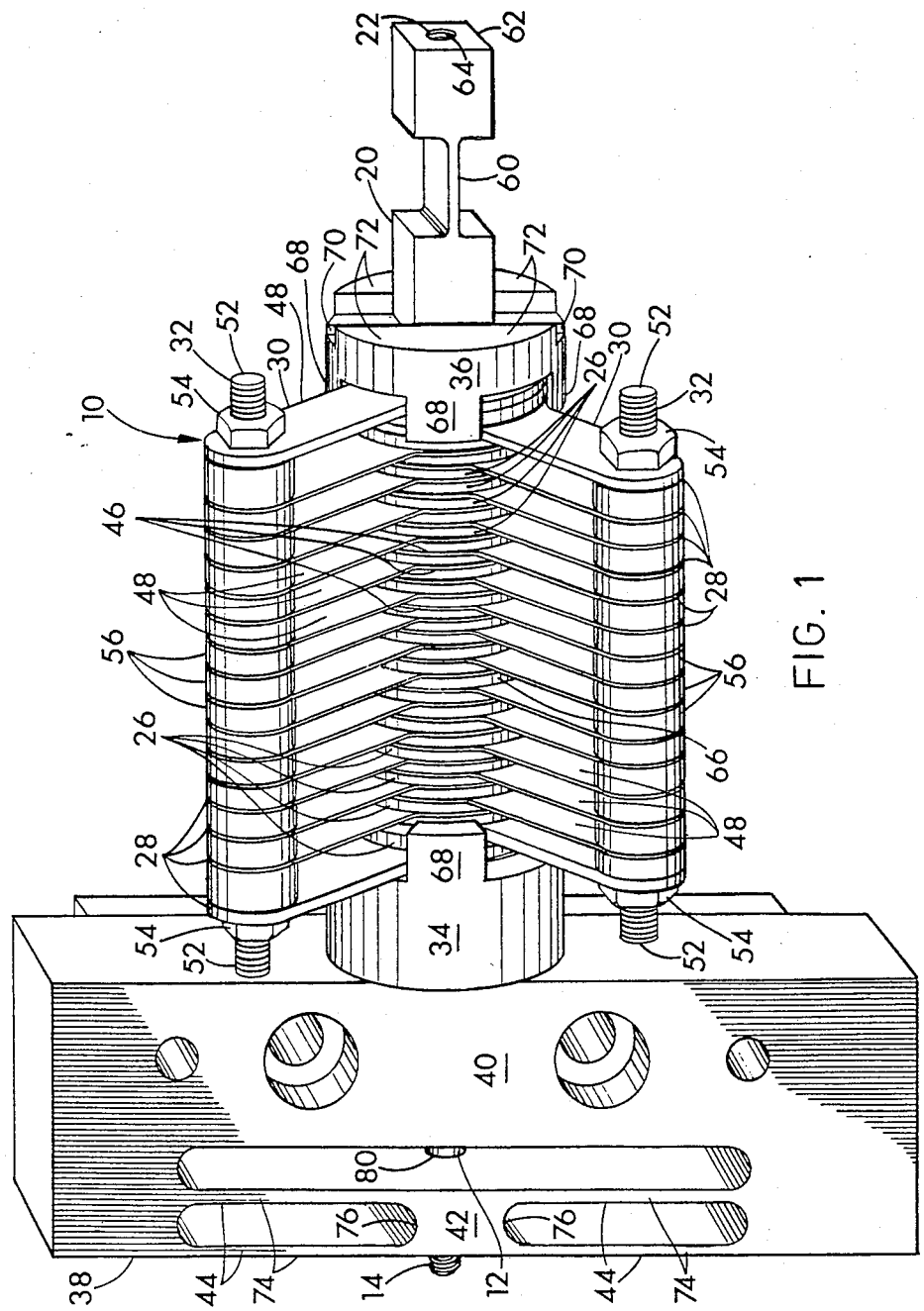
FIG. 1 is a perspective view of a piezoelectric transducer according to the present invention.
Figure 2:
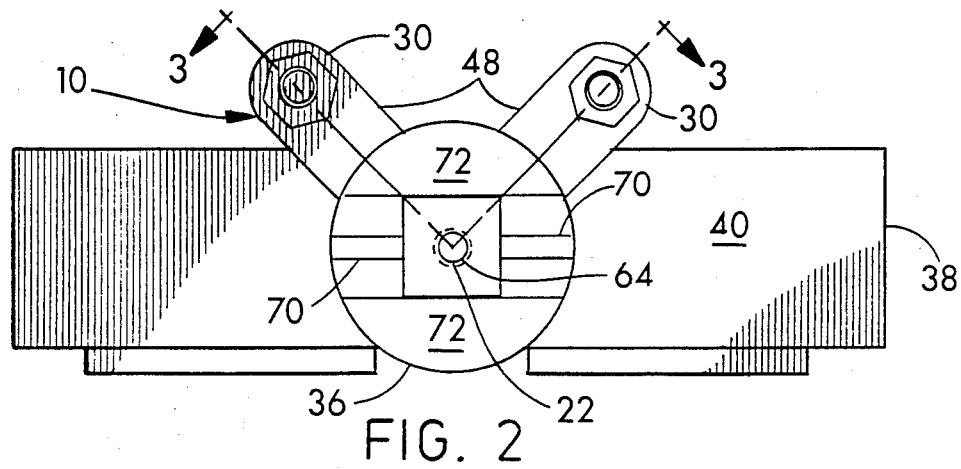
FIG. 2 is an end view of the piezoelectric transducer of FIG. 1, viewing the invention from the end having a distal stop.
Figure 7:
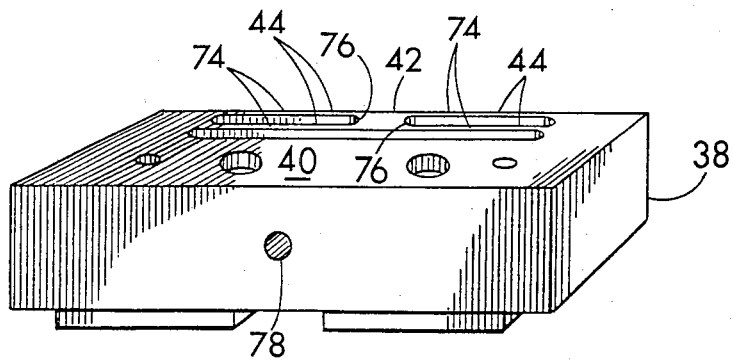
FIG. 7 is a perspective view of a mounting block.
Figure 3:
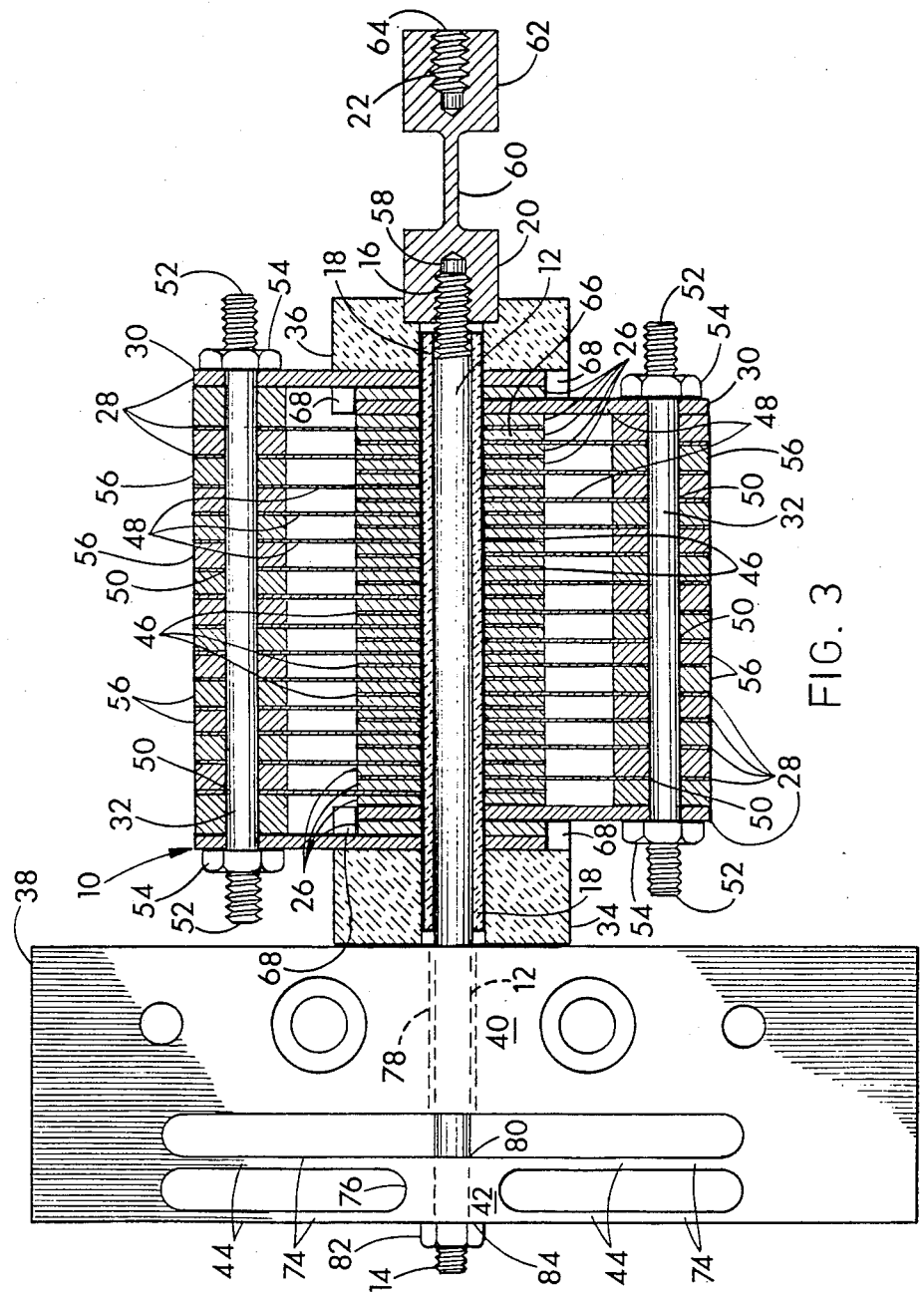
FIG. 3 is a section view taken along section line 3—3 of FIG. 2.

Referring more particularly to the drawings wherein like numbers refer to like parts, FIGS. 1 and 3 show a piezoelectric transducer 10 having an elongated central shaft 12 with a proximal end 14 and a distal end 16, a central insulator 18 which encircles the elongated central shaft 12 so that the proximal end 14 and the distal end 16 extend out from the central insulator 18, a distal stop 20 fixed to the distal end 16 of the shaft 12 and including connection means 22 for connecting to the object to be moved (not shown), and a plurality of piezoelectric disks 26 entrained on the shaft 12 and central insulator 18. The piezoelectric transducer 10 further includes a plurality of electrically conductive plates 28 entrained on the shaft 12 and central insulator 18 which are arranged interspersed alternately with the piezoelectric disks 26. These plates 28 are arranged into two groups 30 with each alternate plate 28 in the alternate group 30. An electrically conductive stud 32 for each of the two groups 30 of plates 28 electrically connects all the plates 28 in the group 30 so that a potential can be imposed on the piezoelectric disks 26 by imposing a potential on the two studs 32. A proximal insulator 34 is entrained on the shaft 12 and central insulator 18 adjacent the electrically conductive plate 28 which is closest to the proximal end 14 of the shaft 12. Additionally, a distal insulator 36 is entrained on the shaft 12 and central insulator 18 adjacent the electrically conductive plate 28 which is closest to the distal end 16 of the shaft 12. This distal insulator 36 is also adjacent to the distal stop 20 which is fixed to the distal end 16 of the shaft 12. A mounting block 38 which includes a fixed portion 40 and a moveable portion 42 which are joined by a flexural spring 44 is shown in FIGS. 1, 3 and 7. The proximal insulator 34 is adjacent to the fixed portion 40 of the mounting block 38. The proximal end 14 of the shaft 12 is secured to the moveable portion 42 of the mounting block 38 so that the proximal insulator 34, the piezoelectric disks 26, the electrically conductive plates 28, and the distal insulator 36 are held pressed between the fixed portion 40 of the mounting block 38 and the distal stop 20.

Referring to FIGS. 1 and 3, each electrically conductive plate 28 includes an annular portion 46 which is entrained on the shaft 12, and an arm 48 which extends radially outward from the annular portion 46. The plates 28 are arranged into two groups 30 with each alternate plate 28 being in the alternate group. The arms 48 of each group 30 of plates 28 extend radially in parallel. As shown in FIG. 3, the two electrically conductives plates 28 of each group 30 which are closest to the ends 14, 16 of the elongated central shaft 12 are thicker than the other plates 28. These outermost plates 28 give structural support to the arms 48 of each group 30 of plates 28. The thickness of the innermost plates 28 is approximately 0.005 inches whereas the thickness of the four outermost plates 28 is approximately 0.032 inches in the preferred embodiment of the present invention. While the preferred piezoelectric transducer 10 has electrically conductive plates made with copper, other suitable highly conductive materials could be used as well. The preferred piezoelectric disks 26 are made from lead titanate or lead zirconate. The arms 48 of each electrically conductive plate 28 has a hole 50 through which one of the electrically conductive studs 32 passes. The electrically conductive stud 32 for each group passes through the holes 50 in the plates 28 of its respective group 30 so that electrical and mechanical contact is made between each stud 32 and its respective group 30 of plates 28. The electrical connection between each stud 32 and its respective group 30 allows a potential to be imposed on the piezoelectric disks 26 interspersed alternately between the electrically conductive plates 28 by imposing a potential on the two studs 32. Tne preferred electrically conductive studs 32 are made from stainless steel which is silverplated to make their surfaces conductive. The ends 52 of each electrically conductive stud 32 are threaded, and stud nuts 54 are screwed onto the ends 52 to hold the studs 32 in place within the holes 50. In the preferred piezoelectric transducer 10 aluminum spacers 56 are entrained on each stud 32 between the adjacent arms 48 of the plates 28 within a group 30 as is best shown in FIG. 3. These aluminum spacers 56 maintain a desired space between the adjacent arms 48 of plates 28 within a group 30.

The elongated central shaft 12 is made with stainless steel which is silverplated. The proximal end 14 and the distal end 16 of the shaft 12 are threaded. The distal stop 20 has a first threaded hole 58 into which the threaded distal end 16 of the shaft 12 is screwed thereby fixing the distal stop 20 to the distal end 16 of the shaft 12. The distal stop 20 includes a flexural hinge 60 which allows movement of the distal stop 20 caused by expansion of the piezoelectric disks to move the object desired moved on a curved or circular path. In this manner the linear expansion of the piezoelectric transducer 10 can be translated into tangential, circular or rotational movement. The object to be moved, however, may also be moved along a straight path as well if desired. The connection means 22 for connecting the object to be moved includes a portion 62 of the distal stop 20 which defines a second threaded hole 64 for receiving a screw (not shown).

The central insulator 18 is located between the elongated central shaft 12 and the electrically conductive plates 28 which are entrained on the shaft 12 and central insulator 18, thereby insulating the shaft 12 from the electrically conductive plates 28. Tne central insulator 18 in the preferred piezoelectric transducer 10 is formed from a heat-resistant material such as quartz or glass which contains appreciable oxide of boron, otherwise known under the trademark Pyrex.

Figure 4:
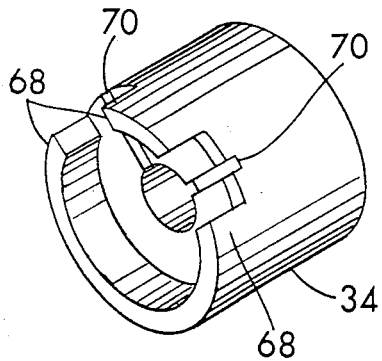
FIG. 4 is a perspective view of an insulator which is adjacent to the mounting block.
Figure 5:
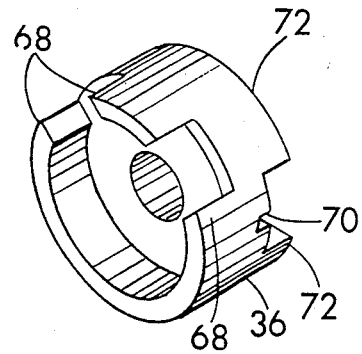
FIG. 5 is a perspective view of an insulator which is adjacent to the distal stop.
Figure 6:
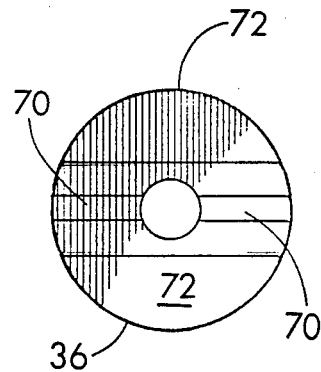
FIG. 6 is a rear view of the insulator which is adjacent to the distal stop.
Figure 8:
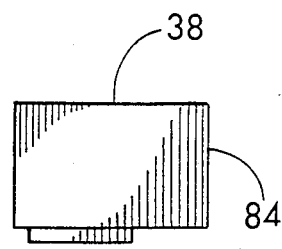
FIG. 8 is a side view of a mounting block.

As stated earlier, a pair of insulators, the proximal insulator 34 and the distal insulator 36 are also entrained on the shaft 12 and central insulator 18. The distal insulator 36 is located adjacent to the distal stop 20 and the proximal insulator 34 adjacent the fixed portion 40 of the mounting block 38 so that both insulators 34, 36, the plates 28 and the piezoelectric disks 26 are held in a stack 66 between the distal stop 20 and the fixed portion 40 of the mounting block 38. Expansion of the piezoelectric disks 26 therefore causes the distal stop 20 to move away from the fixed portion 40 of the mounting block 34. Both the proximal insulator 34 and the distal insulator 36 have projections 68 which engage the arms 48 of the two plates 28 adjacent the insulator 34, 36. These projections 68 are most clearly shown in FIGS. 4 and 5. By fixing the arms 48 of the two plates 38 adjacent the insulator 34, 36 in angular position relative to each other, each insulator 34, 36 thereby fixes all the plates 28 in each of the two groups 30 into a fixed angular position because of the electrically conductive stud 32 which passes through the arms 48 of each group 30 into the fixed plates 28 which are adjacent to the insulator 34, 36. In the preferred piezoelectric transducer 10, the projections 68 upon the insulators 34, 36 engage the arms 48 so that all the arms 48 of one group 30 of plates 28 are at a ninety degree angle to all of the arms 48 of the plates 28 in the other group 30. Alternatively, the insulators 34 could have projections 68 which hold all the arms 48 of one group 30 of plates 28 at some other selected angle to all the arms 48 of the other group 30 of plates 28, such as one hundred and eighty degrees or another angle which is appropriate in the particular environment. The proximal insulator 34 has two radial grooves 70 which are located centrally between the projections 68 which engage the arms 48 of the plates 28. The distal insulator 36 has distal projections 72 as shown in FIGS. 5 and 6 which engage the distal stop 20 so that the distal stop 20, distal insulator 36 and the two groups 30 of arms 48 are fixed in angular position relative to each other. The distal projections 72 fix the angular position of the distal insulator 36 relative to the distal stop 20, and the projections 68 fix the relative angular position of the arms 48 of each group 30 of plates 28 with relationship to each other and also to the distal insulator 36. Additionally, the distal projections 72 prevent the distal stop 20 from becoming unscrewed from the threaded distal end 16 of the elongated central shaft 12. The distal insulator 36 also has radial grooves 70 which are located centrally between, in this case, the distal projection 72. The preferred proximal and distal insulators 34, 36 are made from a material manufactured under the trademark name MACOR (also known as Corning Machinable Glass Ceramic, which is manufactured by Corning Glassworks, of Corning, N.Y.). Other suitable materials which have sufficient strength and ability to resist both heat and the ultra-high vacuum environment may be used instead. As shown most clearly in FIGS. 3, 7, and 8, the mounting block 38 includes a fixed portion 40 and a moveable portion 42 which are joined by a flexural spring 44. The preferred mounting block flexural block 44 includes two pairs of parallel resilient ribs 74 which extend from opposite sides 76 of the moveable portion 42 to the fixed portion 40 of the mounting block 38. The fixed portion 40 of the mounting block 38 has a slip hole 78 through which the elongated central shaft 12 extends to the moveable portion 42 of the mounting block 38 to which the proximal end 14 of the shaft 12 is secured. The elongated central shaft 12 is free to move within this slip hole 78 substantially without friction when the piezoelectric disks 26 expand or contract. The slip hole 78, however, is of smaller diameter than the central insulator 18 so that the central insulator 18 cannot come into the slip hole 78, but remains encapsulated on the shaft 12 between the mounting block 38 and distal stop 20. The shaft 12 also passes through a mounting hole 80 in the moveable portion 42. The proximal end 14 of the shaft 12 is threaded and extends out from the mounting hole 80 to receive a nut 82 which is screwed onto the proximal end 14 threads. When tightened, the nut 82 abuts and presses against an abutment surface 84 on the moveable portion 42 thereby moving the moveable portion 42 and loading the flexural spring 44 so that the shaft 12 is biased to move in the direction of its proximal end 14. This bias places the shaft 12 in tension and squeezes the proximal and distal insulators 34, 36, the plates 28, and the piezoelectric disks 26 between the distal stop 20 and the fixed portion 40 of the mounting block 38. Expansion of the piezoelectric disks 26 under an applied potential moves the distal stop 20 away from the fixed portion 40 of the mounting block 38 against the force of the flexural spring 44 which holds the piezoelectric disks 26 in compression.

In its operation, the piezoelectric transducer 10 is intended to be used in an ultra-high vacuum environment for precision remote movement of an object. A potential is applied to the electrically conductive studs 32 which causes a potential to occur across the piezoelectric disks 26 through the electrically conductive plates 28. Each piezoelectric disk 26 is adjacent to the annular portion 46 of two plates 28, each plate belonging to a different group 30 of plates 28. Therefore, applying a potential to the electrically conductive studs 32 also causes the potential to be applied across the piezoelectric disks 26. This potential causes the piezoelectric disks 26 to expand though resisted by the flexural spring 44. The expansion of the disks 26 moves the distal stop 20 away from the fixed portion 40 of the mounting block 38, thereby moving the object desired moved. Up to a limit, further increases in the potential across the piezoelectric disks causes the disks 26 to expand even further thus increasing the distance between the distal stop 20 and fixed portion 40 of the mounting block 38. Reducing the potential applied across the piezoelectric disks 26 causes the disks 26 to shrink thereby allowing the elongated cental shaft 12 under tension to pull the distal stop 20 closer to the fixed portion 40 of the mounting block 38. By increasing or decreasing the potential across the piezoelectric disks 26, an object may be moved by the transducer 10 away from or closer to the fixed portion 40 of the mounting block 38. A plot of expansion and contraction of the piezoelectric transducer 10 versus applied potential would exhibit the hysteresis which is common to piezoelectric material.

The piezoelectric transducer according to the present invention thus offers several advantages over the prior art devices. Since the arms 48 of the conductive 28 are all tied together machanically, and fixed in angular position by the insulators 34 and 36, fixed angular position of all components is achieved without the need for epoxy or other adhesive. Accordingly, the structure has proved usable in an ultra-high vacuum down to $10^{-10}$ torr. The provision for the flexural spring 44 in the mounting block 38 ensures that the transducer operates effectively and predictably while still being easy to mount and install.

It is to be understood that the present invention is not limited to the particular arrangement and embodiments of parts disclosed and illustrated herein, nor to the material specified, by embraces all such modified forms thereof as come within the scope of the following claims.

What is claimed is:

1. A piezoelectric transducer for precision remote movement of an object in ultra-high vacuum comprising
    (a) an elongated central shaft having a proximal end and a distal end;
    (b) a distal stop fixed to the distal end of the shaft and including connection means for connecting to the object to be moved;
    (c) a mounting block near the proximal end of the shaft, the shaft extending through the mounting block;

(d) biasing means for resiliently biasing the shaft to move in the direction of its proximal end through the mounting block;
(e) a plurality of piezoelectric disks entrained on the shaft;
(f) a plurality of electrically conductive plates entrained on the shaft and arranged interspersed alternately with the piezoelectric disks, each plate including an annular portion entrained on the shaft and an arm extending radially outward from the annular portion, the plates arranged into two groups with each alternate plate being in the alternate group, all the plates of each group having their arms extending radially in parallel;
(g) an electrically conductive stud for each of the two groups of plates, each stud electrically and mechanically joining the arms of all the plates in the group so that a potential applied between the two studs is imposed on the piezoelectric disks; and
(h) a pair of insulators entrained on the shaft, one adjacent the distal stop and one adjacent the mounting block so that the insulators, plates and piezoelectric disks are held in a stack between the distal stop and the mounting block, the insulators having projections to engage the arms of at least two of the plates adjacent the insulator to fix the arms in angular position relative to each other to thus fix all the plates in eacn of the two groups in fixed angular position.

2. The piezoelectric transducer of claim 1 wherein the arm of each electrically conductive plate has a hole and the electrically conductive stud for each group passes through the holes in the plates of its respective group so that electrical and mechanical contact is made between each stud and its respective group of plates.

3. The piezoelectric transducer of claim 2 wherein the projections on the insulators engage the arms so as to fix all the plates in each of the two groups to be at a ninety degree angle to those of the other group.

4. The piezoelectric transducer of claim 1 wherein the distal end of the shaft is threaded and the distal stop has a first threaded hole into which the threaded distal end of the shaft is screwed thereby fixing the distal stop to the distal end of the shaft, and wherein the insulator adjacent the distal stop has distal projections which engage the distal stop to fix the insulator and therefore the two groups of arms in angular position relative to the distal stop.

5. The piezoelectric transducer of claim 4 wherein the distal stop includes a flexural hinge which allows the movement of the distal stop caused by expansion of the piezoelectric disks to move the object to be moved on a curved path.

6. The piezoelectric transducer of claim 5 wherein the connection means for connecting to the object to be moved includes a portion of the distal stop which defines a second threaded hole for receiving a screw.

7. The piezoelectric transducer specified in claim 1 wherein the mounting block includes a fixed portion and a moveable portion joined by a flexural spring, the flexural spring being the biasing means for resiliently biasing the shaft to move in the direction of its proximal end.

8. The piezoelectric transducer specified in claim 7 wherein the mounting block flexural spring includes two pairs of parallel resilient ribs extending from opposite sides of the moveable portion to the fixed portion of the mounting block.

9. The piezoelectric transducer specified in claim 8 wherein the fixed portion of the mounting block has a slip hole through which the central shaft extends to the moveable portion of the mounting block to which the proximal end is secured.

10. The piezoelectric transducer specified in claim 9 wherein the moveable portion of the mounting block has an abutment face and a mounting hole through which the shaft extends, the proximal end of the shaft being threaded and secured to the moveable portion with a nut tightened onto the proximal end threads, the nut abutting and pressing against the abutment surface and moving the moveable portion so that the flexural spring biases the shaft to move in the direction of its proximal end.

11. The piezoelectric transducer specified in claim 1 further including a central insulator located between the elongated central shaft and the electrically conductive plates entrained on the shaft, insulating the shaft from the plates.

12. The piezoelectric transducer specified in claim 11 wherein the central insulator is formed of a heat-resistant material selected from the group consisting of quartz or glass containing appreciable oxide of boron.

13. A piezoelectric transducer for precision remote movement of an object in ultra-high vacuum comprising:
(a) an elongated central shaft having a proximal end and a distal end;
(b) a mounting block near the proximal end of the shaft, the shaft extending through the mounting block;
(c) biasing means for resiliently biasing the shaft to move in the direction of its proximal end through the mounting block:
(d) a plurality of piezoelectric disks entrained on the shaft;
(e) a plurality of electrically conductive plates entrained on the shaft and arranged interspersed alternately with the piezoelectric disks, the plates arranged into two groups with each alternate plate in the alternate group;
(f) an electrically conductive stud for each of the two groups of plates, each stud electrically connecting all of the plates in the group so that a potential applied between the two studs is imposed on the piezoelectric disks; and
(g) a distal stop having two portions, one portion fixed to the distal end of the shaft and the second portion including connection means for connecting to the object to be moved, a flexural hinge to allow the linear movement of the distal stop caused by expansion of the piezoelectric disks to move an object to be moved on a non-linear path.

14. The piezoelectric transducer specified in claim 13 wherein the mounting block includes a fixed portion and a movable portion joined by a flexural spring, the flexural spring being the biasing means for resiliently biasing the shaft to move in the direction of its proximal end.

15. The piezoeletric transducer specified in claim 14 wherein the mounting block flexural spring includes two pairs of parallel resilient ribs extending from opposite sides of the moveable portion to the fixed portion of the mounting block.

16. The piezoelectric transducer specified in claim 15 wherein the fixed portion of the mounting block has a slip hole through which the central shaft extends to the moveable portion of the mounting block to which the proximal end is secured.

17. The piezoelectric transducer specified in claim 16 wherein the moveable portion of the mounting block has an abutment face and a mounting hole through which the shaft extends, the proximal end of the shaft being threaded and secured to the moveable portion with a nut tightened onto the proximal end threads, the nut abutting and pressing against the abutment surface and moving the moveable portion so that the flexural spring biases the shaft to move in the direction of its proximal end.

* * * * *